(12) United States Patent
Monestier et al.

(10) Patent No.: US 9,923,163 B2
(45) Date of Patent: Mar. 20, 2018

(54) CURRENT DISTRIBUTION IN AN ORGANIC LIGHT EMITTING DIODE DEVICE

(71) Applicant: KONINKLIJKE PHILIPS N.V., Eindhoven (NL)

(72) Inventors: Florent Monestier, Aachen (DE); Christian Büttner, Roetgen (DE)

(73) Assignee: OLEDWorks GmbH, Aachen (DE)

( * ) Notice: Subject to any disclaimer, the term of this patent is extended or adjusted under 35 U.S.C. 154(b) by 0 days.

(21) Appl. No.: 15/101,190

(22) PCT Filed: Nov. 19, 2014

(86) PCT No.: PCT/EP2014/074956
§ 371 (c)(1),
(2) Date: Jun. 3, 2016

(87) PCT Pub. No.: WO2015/082213
PCT Pub. Date: Jun. 11, 2015

(65) Prior Publication Data
US 2016/0308160 A1    Oct. 20, 2016

(30) Foreign Application Priority Data
Dec. 3, 2013   (EP) .................................. 13195432

(51) Int. Cl.
*H01L 29/08*     (2006.01)
*H01L 29/04*     (2006.01)
(Continued)

(52) U.S. Cl.
CPC ...... *H01L 51/5209* (2013.01); *H01L 51/0023* (2013.01); *H01L 51/5203* (2013.01); *H01L 51/56* (2013.01); *H01L 2251/5361* (2013.01)

(58) Field of Classification Search
CPC ............ H01L 51/5209; H01L 51/5203; H01L 51/0023; H01L 51/56; H01L 2251/5361; H01L 51/5052; G02F 1/133555
(Continued)

(56) References Cited

U.S. PATENT DOCUMENTS

| 6,344,285 B1* | 2/2002 | Kwon ................. H01L 51/5048 428/690 |
| 2002/0039677 A1* | 4/2002 | Iwamoto ............... H01M 10/05 429/122 |

(Continued)

FOREIGN PATENT DOCUMENTS

WO    2013098534 A1    7/2013

OTHER PUBLICATIONS

Extended European Search Report issued for EP 13195432.3, dated Apr. 25, 2014, 5 pages.
(Continued)

*Primary Examiner* — Dzung Tran (57) ABSTRACT

The invention relates to an organic light emitting diode device having an electrode sheet of a light emitting area and an electrode contact in contact with the electrode sheet, to a method for forming such OLED device and to method of operating such OLED device. In order to provide such OLED device having a reduced tendency for the occurrence of hot spots, the present invention provides for reducing a local and/or average regional current density of a current flowing in operation of the lighting device through an interface between the electrode sheet and the electrode contact in a corner area of the interface.

16 Claims, 5 Drawing Sheets

(51) Int. Cl.
*H01L 33/00* (2010.01)
*H01L 51/52* (2006.01)
*H01L 51/00* (2006.01)
*H01L 51/56* (2006.01)

(58) Field of Classification Search
USPC .............................................. 257/40, 59, 99
See application file for complete search history.

(56) References Cited

U.S. PATENT DOCUMENTS

2005/0270454 A1* 12/2005 Ahn .................. G02F 1/133555
349/114
2008/0118724 A1* 5/2008 Cina ................... H01L 51/5052
428/213
2009/0211640 A1* 8/2009 Lee ....................... B82Y 10/00
136/263
2013/0009199 A1 1/2013 Ingle et al.

OTHER PUBLICATIONS

International Search Report and Written Opinion issued for WO 2015/082213 A1, dated Feb. 2, 2015, 9 pages.

* cited by examiner

PRIOR ART

FIG. 1

PRIOR ART

CURRENT DISTRIBUTION IN AN ORGANIC LIGHT EMITTING DIODE DEVICE

FIELD OF THE INVENTION

The invention relates to an organic light emitting diode device having an electrode sheet of a light emitting area and an electrode contact in contact with the electrode sheet. More specifically, the invention relates to the current distribution in the light emitting area of the organic light emitting diode device. The invention further relates to a forming method for such organic light emitting diode device having an electrode sheet of a light emitting area and an electrode contact in contact with the electrode sheet and to an operating method for such organic light emitting diode device having an electrode sheet of a light emitting area and an electrode contact in contact with the electrode sheet.

BACKGROUND OF THE INVENTION

Luminance homogeneity over the lighting area (or light emitting area) of an organic light emitting diode device (OLED device) has an impact on both, aesthetical perception and reliability of the device. Since luminance is proportional to current density, it is therefore crucial to have very high luminance homogeneity over the life time of the device. A specific aspect of OLED devices is that light is emitted all over the light emitting area.

A drawback involved herewith is that the device is very sensible to current inhomogeneities. The resistance of an organic stack is lower at high current density which forces most of the current flowing over the anode surface to pass through the low resistance area called "hot spot". As a consequence the low resistance area will heat very fast and a runaway loop process will start between current and T° leading to a reduction in life time and possibly to damage and failure very early in the use of the device. This process is accelerated by stress on the device.

Consequently, it is desirable to prevent such weak spots from appearing and to keep the current homogeneity as good as possible along the life time of the device.

In practice, a small area with high local current density could appear easily due if the device is not cooled uniformly over the lighting area: for example, if the device is submitted to forced national convection from bottom to top in case of a vertical arrangement, in case of an inappropriate handling like using a material with different thermal properties over the area to hold the device or simply if better cooling is applied on a limited part of the part of device. A simple local input of energy (like, for example, a light reflection of a spot locally) on the lighting area of the device could also be the cause of hot spot.

Further, it is also desirable to design devices to achieve lower sensibility to mechanical, thermal or electric stresses. This could be done by appropriate substrate layout design and system architecture. Basically, a conventional solution consists in limiting the size of the lighting area and limiting the current stress to prevent the level where runaway loop between current and heat starts from being reached. A second possibility is to improve the current distribution via appropriate substrate layout design. In this case the basic principle is to reduce power losses over the highly resistive ITO anode. In practice, in order to reduce power losses, several solutions are applied by OLED manufacturers. Typical solutions are optimizations of the shape and dimension of electrode contact areas and also optimizations of the anode conductivity.

However, even after an optimization of the layout, the current distribution is never perfectly homogeneous and weak areas with high sensibility to level of external stress (current, temperature) are always generated.

Thus, there is a demand for a possibility of designing OLED devices with a reduced number of hot spots.

It was found that hot spots are usually situated in corners of the light emitting area. In order to address this, a known solution provides for cutting the corners of the light emitting area or for increasing the radius of the corners. A particular drawback of this approach is that the visual perception of the device is disturbed by design irregularities, while cutting the corners and/or increasing the corner radius limits the design options for using the devices.

US-2013/009199 discloses an organic light-emitting device having an active layer with first and second side surfaces adjoining a corner edge, wherein the first side surface has a recessed region adjoining the corner edge. For injecting charge carriers into the active layer, the device has a metallic contact layer extending along the first side surface of the active layer, and comprising a triangular structure so that the nearer it approaches the recessed region, the more it is recessed from the first side surface of the active layer, so that the injection of charge carriers from the metallic contact layer into the active layer is suppressed in the recessed region.

SUMMARY OF THE INVENTION

It is an object of the present invention to provide an organic light emitting diode (OLED) device having an electrode sheet of a light emitting area and an electrode contact in contact with the electrode sheet having a reduced tendency for the occurrence of hot spots while avoiding the disadvantages and limitation provided by the known approach of modifying the geometrical shape of the corners of the device. It is also an object of the present invention to provide a method for manufacturing such OLED device.

In a first aspect of the present invention, the object is achieved by an organic light emitting diode device having an electrode sheet of a light emitting area and an electrode contact in contact with the electrode sheet such that there is an interface between the electrode sheet and the electrode contact, wherein the electrode sheet and the electrode contact are locally separated by a separator that is formed of an isolating material and/or a material having a sheet resistance higher than a sheet resistance of the electrode contact, and wherein the separator is arranged in a corner area of the interface, the corner area being an area in a vicinity of an intersection between two planes defined by portions of the interface, and the separator being arranged at a distance ($L_1$, $L_2$) from the initersection. This organic light emitting diode device is arranged such that a local and/or average regional current density of a current flowing in operation of the OLED device through the interface in a corner area of the interface is reduced.

The invention is based on the following insights:

The luminance of an OLED is determined by the current density which in turn depends on the electrical resistance of the device stack. An area with low electrical resistance will have a high current density. Consequently, it will appear as a bright spot, and it will degrade faster due to increased temperatures. Such an area of high current density is referred to as a "hot spot". In OLED devices hot spots are typically formed at the corners of the light emissive area. An explanation for this fact is that corners are likely to have hot spots as charge injection occurs from two sides. This is addressed by the conventional approach of cutting the corners or increasing the radius of the corner.

The present invention aims at limiting the current occurring in the corner area for addressing the issue of hot spots. If the current density is locally reduced this has an impact on the likelihood of hot spots occurring.

Figure 1:
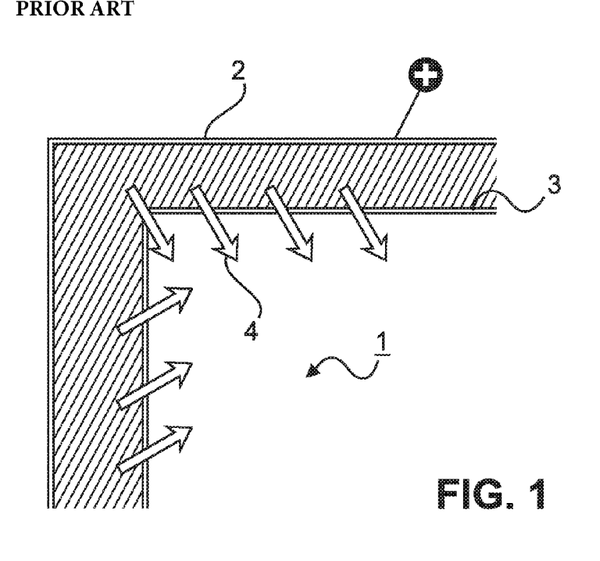
FIG. 1 shows an illustration of a corner of a conventional OLED lighting device.

In a typical design for an OLED lighting device the anode contact area is everywhere around the lighting area to support the high resistance of the transparent anode material (see FIG. 1). The anode contact area allows distributing the current homogenously and without losses all over the contour of lighting area. A drawback of this configuration is that hot spots are generated near the corner of lighting area since the current injection is higher along the diagonal. These hot spots match the location where the distance between edges is minimum, i.e. the diagonal. The "anode contact area" refers to a general space where there could be different kinds of layers like transparent conductive oxides (TCO), metallization and additional current distributor layers to support the conductivity of the metallization. For example, it is known to use an additional layer to support the conductivity of the metallization. Typically, this would be a PCB board, a PCB contour frame, copper strips, flex foil, etc. Such additional layer is usually placed on the outer side of the electrode contacting the anode.

Figure 2:
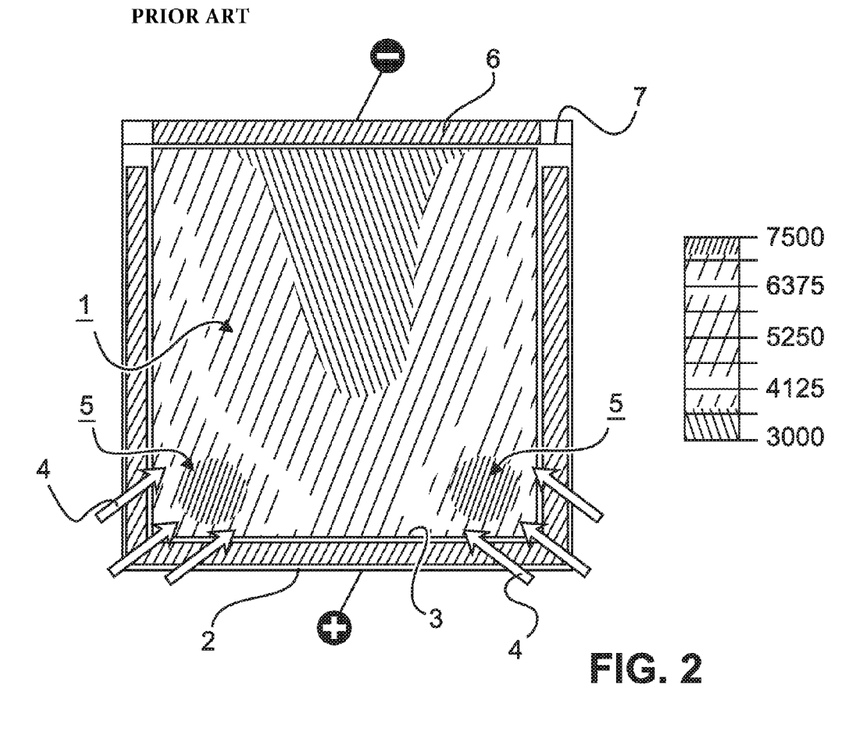
FIG. 2 shows an illustration of a luminance distribution of the OLED lighting device shown in FIG. 1.

A T° transition between the lighting area and the environment is done continuously but only on few mm, therefore the temperature decreases with a high slope between the edge of lighting area and the contact area. As a consequence the hot spot is not situated directly in the corner of the lighting area but shifted few millimeters to the center of lighting area where T° is higher. FIG. 2 shows a calculated example of hot spots near corners of lighting area. For this example, a contact area without metallization was used. The layout of the measured device was a square lighting area of 10.4 by 10.4 cm with three sides of the contact area used to distribute the current over the anode layer and one side used for the cathode layer.

If, deviating from the above example, at a few millimeters of at least one side of the corners, an isolator is provided between the anode contact area and the lighting area, the overall injection in this area is reduced and thus the occurrence of hot spots is reduced.

The separator is formed of an isolating material and/or a material having a sheet resistance higher than a sheet resistance of the electrode contact.

An isolating material may directly be used for selectively blocking current in a predetermined area such that the current density may be adjusted accordingly. An area with lower electrical conductivity (i.e. with higher sheet resistance) is like a high resistance between the light emitting area and the contact area (having high electrical conductivity). As a consequence, there will be higher drop voltage and current injected near areas with lower electrical conductivity will be lower, reducing hot spots in corners.

The separator is arranged is arranged in an area in a vicinity of an intersection between two planes defined by portions of the interface between the electrode sheet and the electrode contact. This area is referred to as a "corner area", and the intersection between two planes is referred to as a "corner". The separator is arranged on at least one side of the corner at a distance from the corner.

It was found to be advantageous not to completely block the current from the corner to the extent of the separator, in particular in case separators are provided on both sides of the corner.

The dimension of separator is preferably linked to the position of a hot spot which would occur without patterning. For a device with efficient heat spreading, the position of the hot spots is typically not dependent on the OLED size. Since one can assume that hot spots are mostly situated about 5 to 10 mm away from the corner, it is preferable to block the current on a length higher or equal to 5 mm for each side of the corners. A design rule might be for each side of the corner that the sum of isolated length area should be equal to or larger than 4 mm.

The separator may also be formed such that, for at least a part of the separator, a width of the separator in a direction perpendicular to the interface decreases with increased distance from the corner.

Forming the non-isolating separator with a depth (thickness in direction perpendicular to the interface) which decreases in the direction away from the corner allows to have a gradient in the voltage drop over the separator (and correspondingly in the current distribution), providing the opportunity for an additional degree of freedom in designing.

The electrode sheet and the electrode contact may also only be partially separated by the separator along a direction perpendicular to a plane of the light emitting area.

It is not necessary that the separator completely interjects between the electrode sheet and the electrode contact to have an effect on the current density. Considering the complete extent of the electrode contact (or the electrode sheet) as the total height of the interface, according to the present embodiment, the separator is provided for just a part of this total height.

For at least a part of the separator, a ratio of the separator along the direction perpendicular to the plane of the light emitting area may decrease with increased distance from the corner.

Similar to the change in depth with a distance from the corner discussed above, also a change in the height of the separator (which might also be an isolator) allows for an additional degree of freedom in designing the OLED device.

The interface, the electrode sheet and/or the electrode contact may be arranged such that in the corner area a local and/or average regional contact resistance between the electrode sheet and the electrode contact is higher than an overall average contact resistance between the electrode sheet and the electrode contact.

As an alternative to or together with providing a separator as discussed above, the contact resistance in the relevant region may be increased to adjust the local or regional current density. The difference in the contact resistance is preferably $10^{-6}$ $\Omega m^2$ or more.

A zone of increased local and/or average regional contact resistance may be provided on at least one side of the corner at a distance from the corner.

In a preferred embodiment, the electrode sheet forms an anode of the organic light emitting diode.

It is to be noted that the present invention may also be applied to the current distribution on the cathode side. However, typically, the cathode side is less critical as the sheet resistance of the cathode is about 30 times lower (which is also reflected in only one side of the OLED device being used for cathode current distribution).

As mentioned before, the corner area is an area in a vicinity of an intersection between two planes defined by portions of the interface between the electrode sheet and the electrode contact. It is to be noted that the two planes are not necessary perpendicular so that the corner provided at the intersection does not necessary have an angle of 90°. The corner area might also be an area in a vicinity of an intersection of two successive planes (portion of lighting area edges) which have an angle of more than 30°.

In a second aspect of the present invention, the object is achieved by a method for manufacturing the organic light emitting diode device according to the first aspect of the present invention, wherein the method comprises the step of providing the separator by a patterning method, before and/or after forming of an organic stack of the organic light emitting diode. In other words, this method comprises the steps of providing, in a corner area of an interface between the electrode sheet and the electrode contact, a separator between the electrode sheet and the electrode contact, wherein the separator is formed of an isolating material and/or a material having a sheet resistance higher than a sheet resistance of the electrode contact, and/or providing, in the corner area, a local and or average regional contact resistance between the electrode sheet and the electrode contact being higher than an average overall contact resistance between the electrode sheet and the electrode contact.

In a preferred embodiment, the patterning method includes laser ablation and/or photolithographic patterning.

A possibility to increase the contact resistance is to reduce the contact area between the layers involved. A contact area can be reduced by adding a material pattern (2D pattern) with low or substantially no conductivity between the layers involved. An isolator material could be deposited with any patterns like for example band patterns, grid patterns, etc.

It shall be understood that the organic light emitting diode device according to the first aspect of the present invention, and the method according to the second aspect of the present invention have similar and/or identical preferred embodiments, in particular, as may be defined in the respective dependent claims.

The present invention is not limited to just OLED lighting devices and may, for example, also be employed in the context of OLED display devices, in particular where the homogeneity of (sub) pixels is important, as it may be the case in large OLED displays used in a stadium or on a street for advertisement or the like.

It shall be understood that a preferred embodiment of the invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

FIG. 1 shows an illustration of a corner of a conventional OLED lighting device.

The OLED lighting device includes an electrode sheet 1 having the lighting area of the OLED lighting device, which is (partially) surrounded by an electrode contact 2 (anode), such that there is an interface 3 between the electrode sheet 1 and the electrode contact 2. Through this interface, in operation of the OLED lighting device, current is flowing, as illustrated by arrows 4.

FIG. 2 shows an illustration of a luminance distribution of the OLED lighting device shown in FIG. 1.

The OLED lighting device shown in FIG. 2 includes the electrode sheet 1, surrounded on three sides by the electrode contact 2 for the anode. The fourth side of the basically square electrode sheet 1 is provided with the electrode contact 6 for the cathode. The anode and cathode are separated by separation 7. The electrode sheet 1 and the contact electrode 2 share an interface 4, through which, in operation, current is flowing as illustrated by arrows 4. Due to the arrangement of the corners (the lower left of which corresponds to the corner shown in FIG. 1), the current density results in higher current injection in the corner areas, leading to the hot spots 5 in each corner. The luminance distribution shown in FIG. 2 for the electrode sheet 1 is based on an actual distribution measured by means of a 2D camera for a square OLED lighting area of 10.4 cm×10.4 cm.

Figure 3:
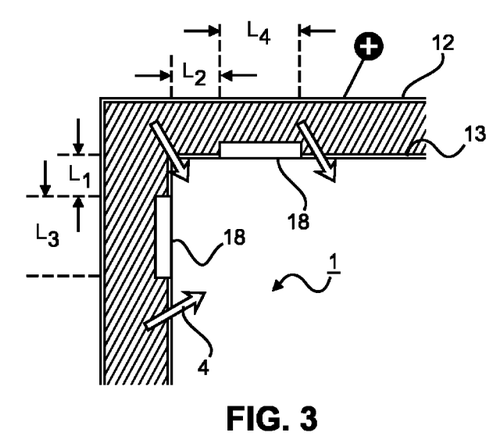
FIG. 3 shows a corner of an OLED lighting device in accordance with an embodiment of the invention.

FIG. 3 shows a corner of an OLED lighting device in accordance with an embodiment of the invention.

The OLED lighting device which is shown in part in FIG. 3 includes an electrode sheet 1 having basically the same structure as a conventional electrode sheet. The electrode sheet 1 is (partially) surrounded by an electrode contact 12 (also an anode as in FIG. 1), such that there is an interface 13 between the electrode sheet 1 and the electrode contact 12. Through this interface, in operation of the OLED lighting device, current is flowing, as illustrated by arrows 4. Differing to the device shown in FIG. 1, in the corner area there are provided two portions of a separator 18, which is provided between the electrode contact 12 and the electrode sheet 1. The separator 18 reduces the local current density as illustrated by arrows 4. The portions of the separator 18 are provided at distances $L_1$ and $L_2$ from the corner itself, respectively, and have an extension or length of $L_3$ and $L_4$, respectively.

In the embodiment shown in FIG. 3, the separator 18 is formed as an isolator, effectively blocking all current through the portions thereof. Alternatively, the separator may also be formed as having an increased sheet resistance in comparison to the electrode contact 12, thus still allowing some current to flow through the separator.

In the illustrated embodiment, further, the portions of the separator are provided at a distance ($L_1$ and $L_2$) from the corner, even though it is also possible to extend the separator over the whole corner area (i.e. to also provide the separator in the corner itself). This also applies to the other embodiments discussed below.

Figure 4:
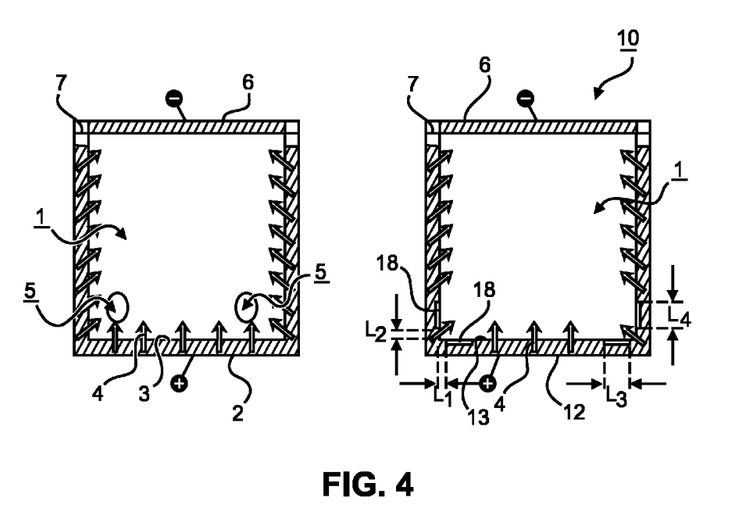
FIG. 4 shows a comparison of the conventional OLED lighting device as shown in FIG. 2 and the OLED lighting device in accordance with the embodiment of the invention shown in FIG. 3.

FIG. 4 shows a comparison of the conventional OLED lighting device as shown in FIG. 2 and the OLED lighting device in accordance with the embodiment of the invention shown in FIG. 3.

The left part of FIG. 4 shows a conventional OLED lighting device as shown in FIG. 2 (without the luminance distribution, while highlighting the positions of the hot spots 5).

The OLED lighting device 10 according to the present embodiment corresponds to the conventional OLED lighting device, except for the provision of the separator 18 as shown in FIG. 3.

According to this embodiment of the invention, the current which goes directly in the corner of lighting area is limited. For that a small strip of few millimeters situated near the corner of lighting area is isolated by means of the separator 18. The purpose is to reduce the current going into areas where the difference between $V_{Oled}$ and T° are maximum. By this way, hot spots 5 situated near the corner of lighting area edges are considerably reduced. According to this embodiment of the invention two edges of each corner are isolated, leaving a space of few millimeters between each isolated edges in order to reduce current injection in the corner but also to prevent to have no injection at all in the corner of the lighting area.

As an example, an electro-thermal simulation of a rectangular device (10.3 cm×10.3 cm) with and without a corner patterned according to the invention was done. The layout configuration of the simulated devices with and without corners patterned is shown in FIG. 4. For this example, the corners of the lighting area 1 were isolated on 2 sides on 16 mm ($L_3=L_4=16$ mm) with a small aperture of 6 mm ($L_1+L_2$).

As a result of the simulation, it could be found that a maximum of luminance in the corner is reduced by around 10% (from 7700 to 7000 Cd/m$^2$) without any power loss.

This concept of hot spot reduction situated near the corner of lighting area could be applied in any devices where the corner of the lighting area is alimented by the same electrode.

It is to be noted that lowering hot spots is not directed to improving significantly the visual perception but mainly to improving the sensibility to external stress and therefore potential reliability issues.

In general, under the assumption that the position of a hot spot is not dependent on the OLED size (for a device with reasonably efficient heat spreading) and that hot spots are typically positioned at a distance of about 5 to 10 millimeters from the corner, preferably the lengths of the portions of the separator are more than 5 mm ($L_3 \geq 3$ mm, $L_4 \geq 3$ mm). Furthermore, it is preferred that the distance of the separator portions from the corner is in the range of 3 to 45 mm.

The above applies also to the embodiments discussed below.

Figure 5:
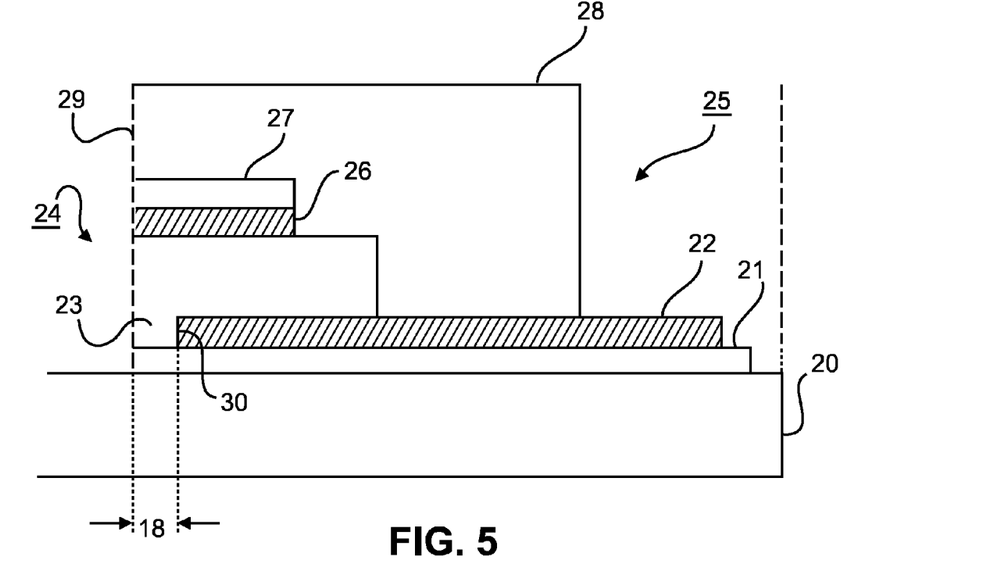
FIG. 5 shows a partial cross section of an OLED lighting device.

FIG. 5 shows a partial cross section of an OLED lighting device in accordance with another embodiment of the invention.

The OLED lighting device shown in FIG. 5 is provided on a glass substrate 20, on which the lighting area 24 and a transparent conductive oxides (TCO) layer 21 with low electrical conductivity are provided. On top of the TCO layer 21 a metallization layer 22 with high electrical conductivity is provided, wherein on top of the metallization layer 22 and between the metallization layer 22 and the lighting area 24 a resist layer 23 is provided for separating the metallization layer 22 from the lighting area 24 and the further cathode and organics layers 26, 27 provided on top of the resist layer 23. Between the lighting area 24 and the electrical contact area 25 a thin film encapsulation (TFE) layer 28 is provided.

The edge 29 of OLED lighting area is defined by inner edge of resist layer 23. The resist layer 23 is a ring contour underlying all evaporated layers in order to prevent any short circuits. The inner edge 30 of the metallization layer 22 is covered by the resist layer 23. Therefore there is a space between the resist edge 29 and the metallization edge 30 where there is only an electrode connection by means of the TCO layer 21 with low electrical conductivity. This space may be varied between few microns and few millimeters. According to the invention, the size of this space is tuned (situated between edge of lighting area and metallization) in order to limit the current injection at specific locations like near the corners.

It is to be noted that the configuration described above is just an example. In other embodiments, the separator 18 between the resist edge 29 and the metallization edge 30 could be very small or even not present. In other embodiments, no metallization is used and only a PCB edge board is placed along the contour of the contact area (current distributor). In such case the current distribution remains the same as for metallization except that the average level of current is reduced.

Figure 6:
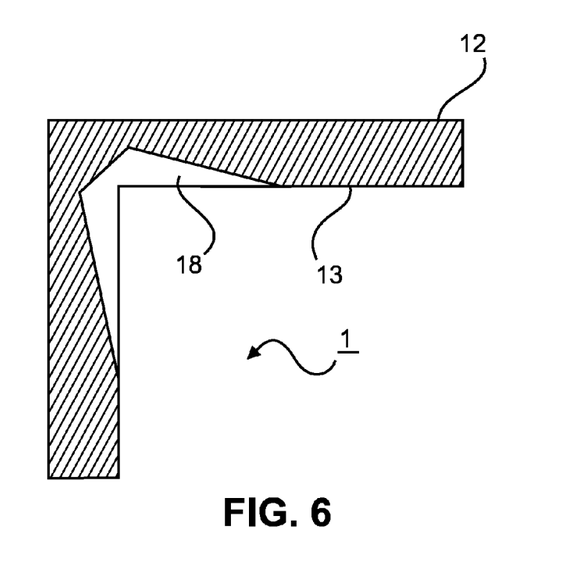
FIG. 6 shows a corner of an OLED lighting device.

FIG. 6 shows a corner of an OLED lighting device in accordance with yet another embodiment of the invention.

The OLED lighting device which is shown in part in FIG. 6 includes an electrode sheet 1 having basically the same structure as a conventional electrode sheet or as the electrode sheet 1 shown in FIG. 3. The electrode sheet 1 is (partially) surrounded by an electrode contact 12 (also an anode as in FIGS. 1 and 3), such that there is an interface 13 between the electrode sheet 1 and the electrode contact 12. Through this interface, in operation of the OLED lighting device, current is flowing.

Differing to the embodiment shown in FIG. 3, in the corner area there is provided a continuous separator 18, which is provided between the electrode contact 12 and the electrode sheet 1. The separator 18 tapers out from the corner such that a thickness in a direction perpendicular to the interface 13 is reduced from the corner towards the ends of the separator, respectively. As the separator 18, which in this embodiment is provided as having a higher sheet resistance than the electrode contact 12, just reduces the current density flowing through respective portions of the interface 13, the current density distribution has a continuous gradient (corresponding to the voltage drop over the combination of separator 18 and electrode contact 12 shifting section by section to just the electrode contact 12).

Figure 7:
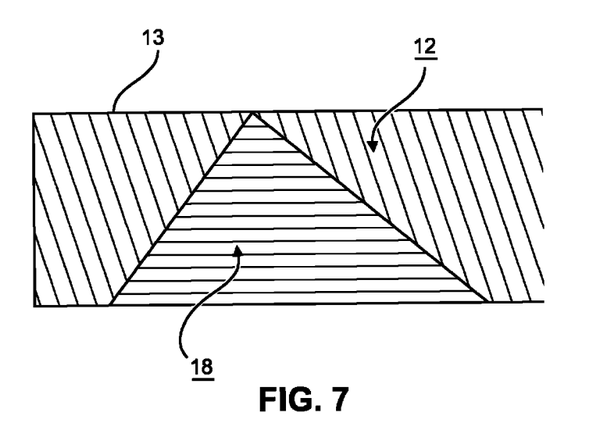
FIG. 7 illustrates a partial section of an interface between an electrode contact and an electrode sheet of an OLED lighting device.

FIG. 7 illustrates a partial section of an interface between an electrode contact and an electrode sheet of an OLED lighting device in accordance with a further embodiment of the invention.

The view provided for FIG. 7 is perpendicular to the views of FIGS. 1, 3 and 6. In FIG. 7, the corner of the OLED device is at the left edge of the interface shown. The current flowing through the interface 13 during operation of the OLED device is flown perpendicular to the paper plane. At the interface 13 (more precisely between the electrode contact 12 and the electrode sheet (not shown), there is provided a separator 18. In height direction, the separator 18 has wedge shape, wherein this shape provides for a gradient in the overall current distribution similar to the embodiment shown in FIG. 6.

Figure 8:
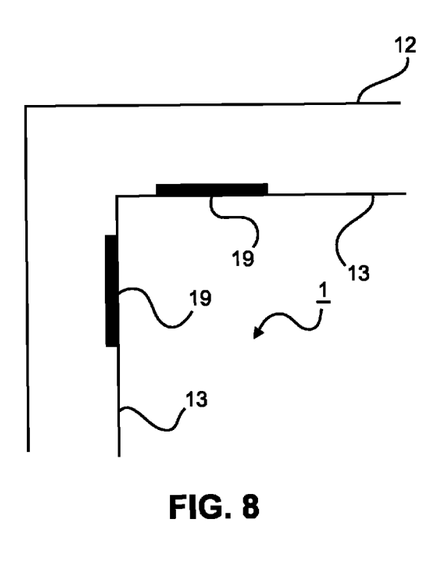
FIG. 8 shows a corner of an OLED lighting device in accordance with an embodiment of the invention.

FIG. 8 shows a corner of an OLED lighting device in accordance with yet a further embodiment of the invention.

The OLED lighting device which is shown in part in FIG. 8 includes an electrode sheet 1 having basically the same structure as a conventional electrode sheet or as the electrode sheet 1 shown in FIGS. 3 and 6. The electrode sheet 1 is (partially) surrounded by an electrode contact 12 (also an anode as in FIGS. 1, 3 and 6), such that there is an interface 13 between the electrode sheet 1 and the electrode contact 12. Through this interface, in operation of the OLED lighting device, current is flowing.

Differing to the embodiments shown in FIG. 3 or 6, instead of a separator provided between the electrode contact 12 and the electrode sheet 1, in two portions 19 spaced in some distance to the corner the contact resistance between the electrode contact 12 and the electrode sheet 1 is increased such that the current density of the current flowing through these portions during operation of the OLED device is less than the current density of the current flowing through the interface area outside the portions 19, thereby reducing the occurrence of hot spots similar to the other embodiments.

Figure 9:
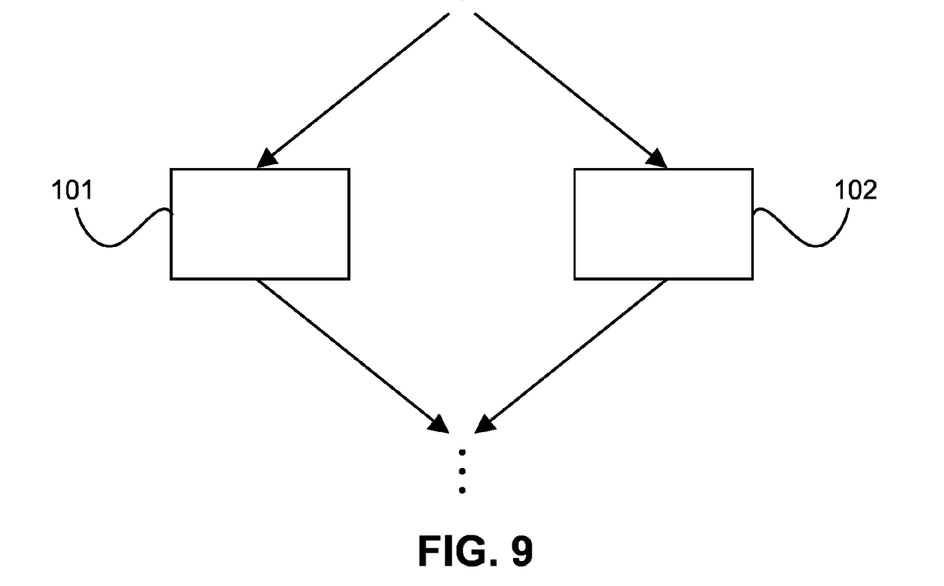
FIG. 9 shows a flow diagram illustrating a method of manufacturing an OLED device in accordance with an embodiment of the invention.

FIG. 9 shows a flow diagram illustrating a method of forming an OLED device in accordance with an embodiment of the invention.

The method for forming an organic light emitting diode device in accordance with the present invention comprises several steps corresponding to conventional method which are not shown here followed by at least one of a separation step 101 of providing, in a corner area of an interface between an electrode sheet and an electrode contact of the OLED device, a separator between the electrode sheet and the electrode contact, wherein the separator is formed of an isolating material and/or a material having a sheet resistance higher than a sheet resistance of the electrode contact, and a contact resistance step 102 of providing, in the corner area, a local and or average regional contact resistance between the electrode sheet and the electrode contact being higher than an average overall contact resistance between the electrode sheet and the electrode contact. Following these steps, further steps are provided, again corresponding to conventional methods.

Figure 10:
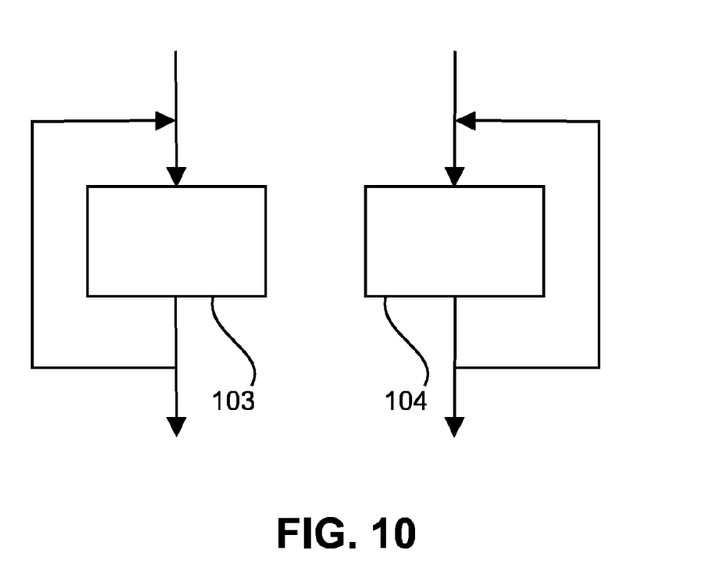
FIG. 10 shows a flow diagram illustrating a method of operating an OLED device.

FIG. 10 shows a flow diagram illustrating a method of operating an OLED device in accordance with an embodiment of the invention. The method of operating the OLED device according to the present invention provides two aspects, which are shown here as steps for explanation's sake even though these aspects are not discrete per se and occur continuously. In aspect 103, a first (local or average regional) current density of a current flowing through an interface between the electrode sheet and the electrode contact is provided in a corner area of the interface. In aspect 104, a second (local or average regional) current density of a current flowing through the interface between the electrode sheet and the electrode contact is provided outside the corner area of the interface. According to the present invention, the first current density is less than the second current density.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

An indication like "a value is between a lower limit and an upper limit, inclusive" is to be understood and that the value may have any value inside the given range including the values of the lower limit and the upper limit.

Any reference signs in the claims should not be construed as limiting the scope.

The invention claimed is:

1. An organic light emitting diode device having an electrode sheet of a light emitting area and an electrode contact in contact with the electrode sheet, the electrode sheet being at least partially surrounded by the electrode contact such that there is an interface between the light emitting area and the electrode contact,
   wherein the light emitting area and the electrode contact are locally separated by a separator that is formed of an isolating material and/or a material having a sheet resistance higher than a sheet resistance of the electrode contact, and
   wherein there is an intersection between two planes defined by portions of the interface, and the separator being arranged on at least one side of the interface at a distance $L_1$ away from the intersection.

2. The organic light emitting diode device according to claim 1, wherein the electrode sheet forms an anode of the organic light emitting diode.

3. A method for manufacturing the organic light emitting diode device according to claim 1, wherein the method comprises the step of providing the separator by a patterning method, before and/or after forming of an organic stack of the organic light emitting diode.

4. The method according to claim 3, wherein the patterning method includes laser ablation and/or photolithographic patterning.

5. A method for manufacturing the organic light emitting diode device according to claim 2, wherein the method comprises the step of providing the separator by a patterning method, before and/or after forming of an organic stack of the organic light emitting diode.

6. The method according to claim 5, wherein the patterning method includes laser ablation and/or photolithographic patterning.

7. The organic light emitting diode device according to claim 1 wherein two separators are provided along each side of the corner, the first separator being located at a distance $L_1$ from the intersection and the second separator being located at a distance $L_2$ from the intersection.

8. The organic light emitting diode device according to claim 1 wherein the interface is where the electrode contact is arranged on top of the electrode sheet.

9. An organic light emitting diode device having an electrode sheet of a light emitting area and an electrode contact in contact with the electrode sheet, the electrode sheet being at least partially surrounded by the electrode contact such that there is an interface between the electrode sheet and the electrode contact,
   wherein the electrode sheet and the electrode contact are locally separated by a separator that is formed of an isolating material and/or a material having a sheet resistance higher than a sheet resistance of the electrode contact, and
   wherein there is an intersection between two planes defined by portions of the interface, and the separator being arranged on at least one side of the interface at a distance $L_1$ away from the intersection.

10. The organic light emitting diode device according to claim 9 wherein separators are provided along both sides of the corner; the first separator being located at a distance $L_1$ from the intersection and the second separator being located at a distance $L_2$ from the intersection.

11. The organic light emitting diode device according to claim 9 wherein the electrode sheet forms an anode of the organic light emitting diode.

12. The organic light emitting diode device according to claim 11 wherein the electrode contact is an additional metallization layer on top of the anode and located on the outer side of the anode.

13. The organic light emitting diode device according to claim 9 wherein the separator is located in the interface between the electrode sheet and the electrode contact such that the current flow during the device operation is perpendicular to the plane.

14. The organic light emitting diode device according to claim 13 wherein the separator has, in its height direction, a wedge shape.

15. The organic light emitting diode-device of claim 1 where the light emitting area and the electrode contact are in contact at the intersection.

16. The organic light emitting diode-device of claim 9 where the electrode sheet and the electrode contact are in contact at the intersection.

\* \* \* \* \*